(12) United States Patent
Strijker et al.

(10) Patent No.: US 9,743,468 B2
(45) Date of Patent: Aug. 22, 2017

(54) CONTROLLER

(71) Applicant: NXP B.V., Eindhoven (NL)

(72) Inventors: Joan Wichard Strijker, Nijmegen (NL); Leendert van den Broeke, Nijmegen (NL)

(73) Assignee: NXP B.V., Eindhoven (NL)

(*) Notice: Subject to any disclaimer, the term of this patent is extended or adjusted under 35 U.S.C. 154(b) by 0 days.

(21) Appl. No.: 14/707,481

(22) Filed: May 8, 2015

(65) Prior Publication Data

US 2015/0334795 A1 Nov. 19, 2015

(51) Int. Cl.
| | | |
|---|---|---|
| *H05B 33/08* | (2006.01) | |
| *H01L 29/06* | (2006.01) | |
| *H01L 27/02* | (2006.01) | |
| *H01L 29/74* | (2006.01) | |
| *H01L 29/732* | (2006.01) | |
| *H01L 29/861* | (2006.01) | |
| *H01L 49/02* | (2006.01) | |
| *H02M 7/217* | (2006.01) | |
| *H01L 29/87* | (2006.01) | |

(52) U.S. Cl.
CPC ..... *H05B 33/0815* (2013.01); *H01L 27/0255* (2013.01); *H01L 27/0259* (2013.01); *H01L 27/0262* (2013.01); *H01L 27/0288* (2013.01); *H01L 28/20* (2013.01); *H01L 29/0638* (2013.01); *H01L 29/0684* (2013.01); *H01L 29/732* (2013.01); *H01L 29/74* (2013.01); *H01L 29/861* (2013.01); *H01L 29/87* (2013.01); *H02M 7/217* (2013.01)

(58) Field of Classification Search
CPC ....... G05F 1/70; H02M 7/217; H02M 1/4225; H05B 33/0815; H05B 33/0818; H03M 3/476

USPC ........... 315/291–297, 192, 307, 247; 363/59, 363/84–49; 323/222
See application file for complete search history.

(56) References Cited

U.S. PATENT DOCUMENTS

| | | | |
|---|---|---|---|
| 7,266,001 B1* | 9/2007 | Notohamiprodjo | H02M 1/42 363/59 |
| 8,212,493 B2* | 7/2012 | Melanson | H02M 3/3374 315/247 |
| 8,644,041 B2 | 2/2014 | Pansier | |

(Continued)

FOREIGN PATENT DOCUMENTS

| | | |
|---|---|---|
| DE | 10 2012 010 691 A1 | 12/2013 |
| WO | 2010/082172 A1 | 7/2010 |

OTHER PUBLICATIONS

NXP B.V., TEA1750, GreenChip III SMPS control IC, Product Data Sheet, Rev. 2, 29 pgs. (Dec. 15, 2008).

(Continued)

*Primary Examiner* — Alexander H Taningco
*Assistant Examiner* — Renan Luque

(57) ABSTRACT

The disclosure relates to a controller (606) for a switched mode power supply, SMPS (600), comprising: a switch toggling unit (670) having a first switching mode and a second switching mode, wherein the first switching mode is a continuous conduction mode or a boundary conduction mode and the second conduction mode is a discontinuous conduction mode; and a switch mode selector (676) configured to set the switching mode of the switch toggling unit (670) in accordance with a current in an inductor (602) of the SMPS (600).

11 Claims, 7 Drawing Sheets

(56) References Cited

U.S. PATENT DOCUMENTS

| | | | |
|---|---|---|---|
| 2003/0128555 A1 | 7/2003 | Schemmann et al. | |
| 2006/0125454 A1* | 6/2006 | Chen | H02M 3/1588 323/282 |
| 2008/0088289 A1* | 4/2008 | Fogg | H02M 3/156 323/283 |
| 2008/0205103 A1* | 8/2008 | Sutardja | G05F 1/70 363/84 |
| 2010/0156377 A1 | 6/2010 | Siegler | |
| 2011/0211377 A1* | 9/2011 | Uno | H02M 1/4225 363/124 |
| 2015/0207399 A1* | 7/2015 | Li | H02M 1/14 315/210 |
| 2015/0303790 A1* | 10/2015 | Lin | H02M 1/4225 363/89 |

OTHER PUBLICATIONS

Extended European Search Report for EP Patent Appln. No. 14176592.5 (Nov. 3, 2013).

* cited by examiner

CONTROLLER

CROSS-REFERENCE TO RELATED APPLICATIONS

This application claims the priority under 35 U.S.C. §119 of European patent application no. 14169166.7, filed on May 20, 2014, the contents of which are incorporated by reference herein.

This disclosure relates to a controller for a switched mode power supply such as a buck or flyback converter.

Power supply units for electronic devices such as televisions, personal computers (PCs), audio equipment, and personal digital assistants are typically required to supply a DC output voltage. Switched mode power supplies (SMPS) are commonly used in power supply units to convert a source, such as a mains input voltage into a desired output voltage. A SMPS comprises a switch arranged between an input and an output of the switched mode power supply. The switch is typically provided by a field effect transistor and is operable between an open state and a closed state. The SMPS also provides a controller that acts as a switch toggling unit configured to toggle the switch between the open state and the closed state in order to transfer energy from the input to the output of the power supply. This toggling is conducted periodically and can be conducted at a frequency of tens or hundreds of kilo Hertz, typically between 20 kHz and 200 kHz.

Each switching cycle of an SMPS has a primary stroke and a secondary stroke. In the primary stroke, the switch is closed and energy from the mains supply is transferred to an inductor of the SMPS. In the secondary stroke, the switch is opened and the energy stored in the inductor is discharge and provided at the output of the mains supply. Several modes of operation of a power supply are possible. These include:
- boundary conduction mode (BCM), in which the switch is controlled such that a primary stroke of the next switching cycle commences immediately on the energy in the inductor falling to zero at the end of the secondary stroke;
- continuous conduction mode, in which the switch is controlled such that a primary stroke of the next switching cycle commences before the energy in the inductor falls to zero during the secondary stroke; and
- discontinuous conduction mode, in which the switch is controlled such that a primary stroke of the next switching cycle commences after a delay period has elapsed after the end of the secondary stroke.

According to a first aspect of the invention there is provided a controller for a switched mode power supply, SMPS, comprising:
- a switch toggling unit having a first switching mode and a second switching mode, wherein the first switching mode is a continuous conduction mode or a boundary conduction mode and the second conduction mode is a discontinuous conduction mode; and
- a switch mode selector configured to set the switching mode of the switch toggling unit in accordance with a current in an inductor of the SMPS.

At least one switching cycle may occur in the discontinuous conduction mode. For example, a plurality of switching cycle may occur in the discontinuous conduction mode. A frequency of the second switching mode may be less than a frequency of the first switching mode.

The switch mode selector may be configured to set the switching mode of the switch toggling unit as the first switching mode if the current in the inductor of the SMPS is greater than a first threshold. The switch mode selector may be configured to set the switching mode of the switch toggling unit as the second switching mode if the current in the inductor of the SMPS is less than a second threshold. The first threshold may be the same as, or different from, the second threshold.

The switch mode selector may be configured to set the switching mode of the switch toggling unit in accordance with a peak current in an inductor of the SMPS. The switch mode selector may be configured to determine the current in the inductor of the SMPS based on a measurement of a voltage across a sense resistor of the SMPS that is connected in series with the inductor of the SMPS.

The switch may be operated in the second switching mode in order to define a primary stroke, a secondary stroke and a delay period. The delay period may be provided after the secondary stroke. Each cycle of the second switching mode may comprise a delay period with a fixed duration. The second switching mode may be a fixed frequency switching mode. For example, the duration of a sum of the primary stroke, the secondary stroke and the delay period of each cycle of the second switching mode may be fixed. The duration of a sum of the secondary stroke and the delay period of each cycle of the second switching mode may be fixed. Any of the above fixed durations may be less than one of 0.005 ms, 0.01 ms, 0.02 ms or 0.05 ms, for example.

The fixed frequency of the second switching mode may be non-zero. The discontinuous conduction mode may have a variable, non-zero switching frequency. A frequency of the second switching mode may be less than one of 20, 25, 30, 40 or 50 kHz. The frequency of the second switching mode may be greater than 15 kHz. Preferably, the frequency of the second switching mode is greater than audible frequencies, so greater than about 20 kHz, for example.

The controller is provided in a single package with six or fewer terminals for connecting to components of the switched mode power supply.

The controller may comprise a boundary conduction mode detector timer configured to detect an end of a secondary stroke during the first conduction mode. The controller may comprise a delay timer configured to provide a delay interval in the second conduction mode. The controller may comprise a primary stroke timer configured to provide a primary stroke delay period for controlling a switch of the SMPS in accordance with a difference between the current in the inductor of the SMPS and a reference current. The difference may be an average difference. The primary stroke timer may be triggered by a signal from the boundary conduction mode detector or the delay timer.

According to a further aspect of the invention there is provided a switched mode power supply, SMPS, comprising the controller of any preceding claim. The switched mode power supply may be a buck or flyback converter, for example.

According to a further aspect of the invention there is provided an LED lighting system comprising any controller or switched mode power supply disclosed herein.

There may be provided an integrated circuit comprising any controller, circuit or switched mode power supply disclosed herein.

There may be provided a computer program, which when run on a computer, causes the computer to configure any apparatus, including a circuit, controller, switched mode power supply, or device disclosed herein or perform any method disclosed herein. The computer program may be a software implementation, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software may be an assembly program.

The computer program may be provided on a computer readable medium, which may be a physical computer readable medium such as a disc or a memory device, or may be embodied as a transient signal. Such a transient signal may be a network download, including an internet download.

One or more embodiments of the invention will now be described, by way of example only, and with reference to the accompanying figures in which:

FIG. 2c illustrates the inductor current of FIG. 2b overlaid on the rectified mains signal of FIG. 2a;

FIG. 8b illustrates an example averaging unit for the controller of FIG. 8a;

In flyback, buck or buck-boost switched mode power supplies (SMPSs), the output power of the SMPS can be controlled by regulating a duty cycle and switching frequency of a power switch. For duty cycle control, a peak current or on-time (a duration of a primary stroke of the SMPS) is controlled. The switching frequency can be set by a controller of the SMPS such that the SMPS runs in a quasi-resonant mode (such as boundary conduction mode (BCM)). The energy converted by the SMPS is a function of a peak current in an inductor of the SMPS, the duration of the primary stroke in each switching cycle and the switching frequency of the SMPS. For a controller operating in boundary conduction mode (BCM) and required to provide a given output voltage, the switching frequency of the SMPS typically increases when the on-time or peak current in the inductor is reduced. The increase in switching frequency causes a corresponding increase in switching losses in the controller.

Figure 1A:
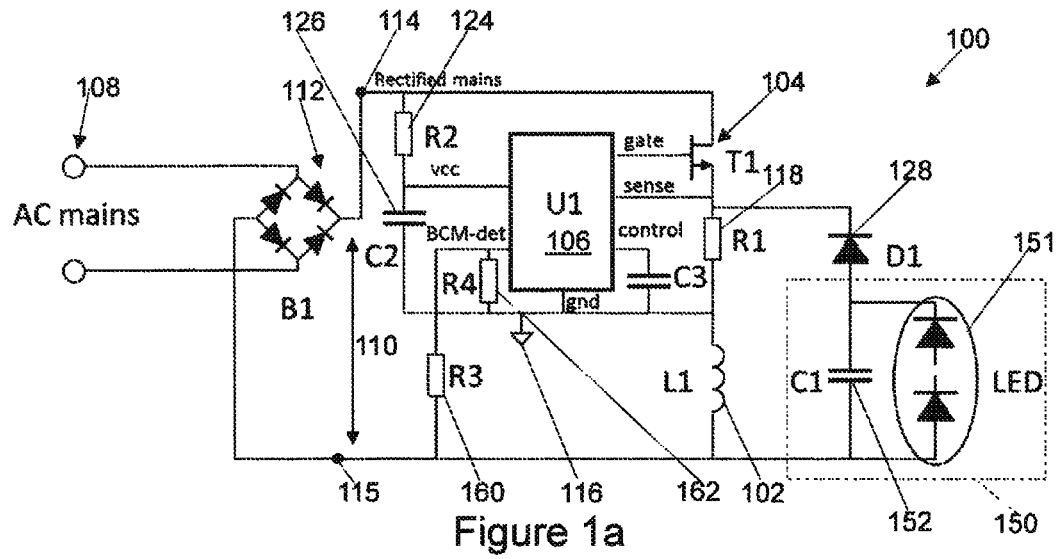
FIG. 1a illustrates a schematic of a buck-boost switched mode power supply (SMPS)

FIG. 1a illustrates a buck-boost switched mode power supply (SMPS) 100. The SMPS 100 comprises an inductor 102, a power switch 104 and a controller 106. The SMPS 100 is configured to receive an AC mains voltage at mains input terminals 108 of the SMPS 100. The mains voltage is converted to a rectified mains voltage 110 by a rectifier 112. The rectified mains voltage 110 is provided between a first rectified mains terminal 114 and a second rectified mains terminal 115.

The power switch 104 is provided by a field effect transistor in this example. A conduction channel of the power switch 104 is connected between the rectified mains terminal 114 and a buck loop. The buck loop comprises the inductor 102, a sense resistor 118, a buck diode 128 and an output element 150. The sense resistor 118 has a first terminal and a second terminal. The inductor 102 is connected between the ground 116 and the second rectified mains terminal 115. The first terminal of the sense resistor 118 is connected to the power switch 104. The second terminal of the sense resistor 118 is connected to a ground 116. The buck diode 128 and the output element 150 are connected in series between the second rectified mains terminal 115 and the first terminal of the sense resistor 118. The output element 150, which represents a load of the SMPS 500, comprises a string of LEDs 151 provided in parallel with a buffer capacitor 152.

The controller 106 in this example may be provided by a SMPS controller that has six terminals. The six terminals of the controller 106 include:

1) a ground terminal, gnd, connected to the ground 116;
2) a voltage sensing terminal, sense, connected to a junction between the power switch 104 and the first terminal of the sense resistor 118;
3) a control terminal, control, connected to a junction between the inductor 102 and the second terminal of the sense resistor 118;
4) a Vcc terminal, Vcc, for receiving the controller input voltage from the rectified mains terminal 114;
5) a switch gate terminal, gate, for providing a switch control signal to a gate of the power switch 104; and
6) a boundary conduction mode detection terminal, bcm-det, for receiving a signal from the inductor 102 in order for the controller to determine when the energy in the inductor 102 has reached zero.

A supply resistor 124 and a supply capacitor 126 are connected in series between the first rectified mains input 114 and the ground 116. The supply capacitor 126 has a first terminal and a second terminal. The first terminal of the supply capacitor 126 is coupled to the Vcc terminal, Vcc, of the controller 106. The second terminal of the supply capacitor 126 is connected to ground 116.

The boundary conduction mode (BCM) detection terminal, bcm-det, of the controller 106 is connected to the power switch 104 (and the second rectified mains voltage terminal 115) via a potential divider. The potential divider has a first potential divider resistor 160 and a second potential divider resistor 162 connected in series between the second rectified mains voltage 115 and ground 116. The BCM detection terminal, bcm-det, is connected to a junction between the first and second potential divider resistors 160, 162.

The controller 106 acts as a switch toggling unit that is configured to toggle the power switch 104 between the open state and the closed state in order to transfer energy from the mains input terminals 108 to the output element 150. The switch toggling unit defines a switching cycle with a primary stroke and a secondary stroke. During the primary stroke, the power switch 104 is closed and energy is stored in the inductor 102. In the secondary stroke, the power switch 104 is opened and energy stored in the inductor 102 is transferred to the output element 150.

Figure 1B:
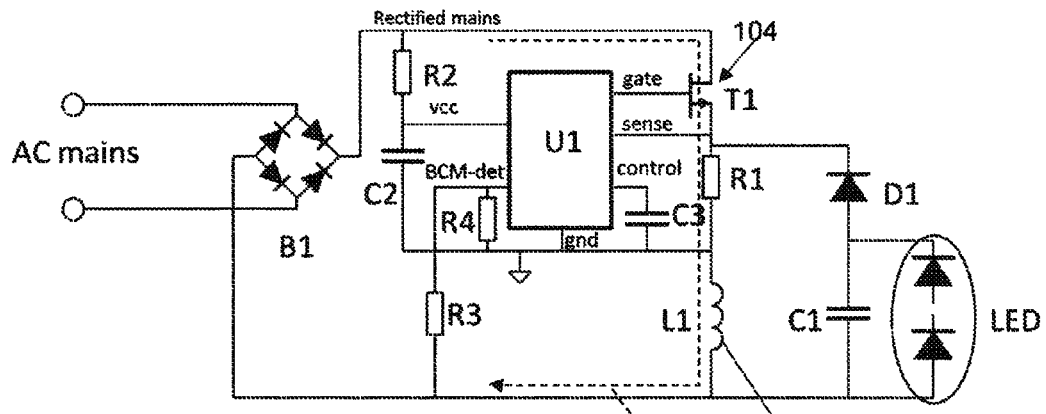
FIG. 1b illustrates a current path through a power switch and an inductor of the SMPS of FIG. 1a during a primary stroke of the SMPS.

FIG. 1b illustrates a current path 166 through the power switch 104 and inductor 102 when energy is transferred to the inductor 102 during the primary stroke.

Figure 1C:
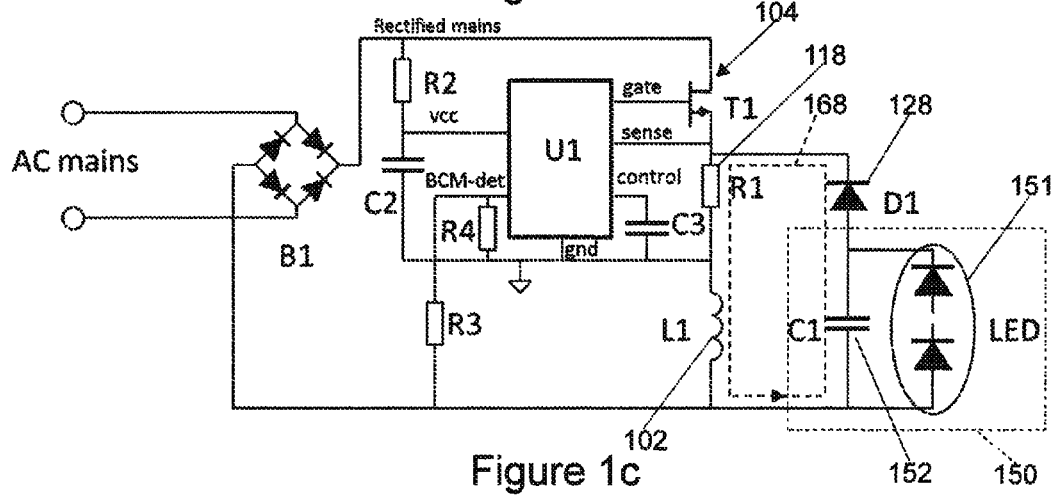
FIG. 1c illustrates a current path in a buck loop of the SMPS of FIG. 1a during a secondary stroke of the SMPS.

FIG. 1c illustrates a current path 168 through the buck loop when energy is transferred from the inductor 102 to the output element 150 during the secondary stroke. The buffer capacitor 152 filters current, resulting in a substantially direct current in the LED string 151.

In order to regulate an LED current in the LED string 151, the current through the sense resistor 118 can be measured during the secondary stroke. The average current through the sense resistor 118 during the secondary stroke is equal to the average LED current. The voltage sensing terminal, sense, can be used to determine if a high current condition exists in the inductor 102. The high current condition may be caused by a fault in the SMPS 100. If the high current condition is present then operation of the controller may be suspended for safety reasons.

The operation of the controller 100 is described further below with reference to the signal profiles of FIGS. 2a to 2c and 3.

Figure 2A:
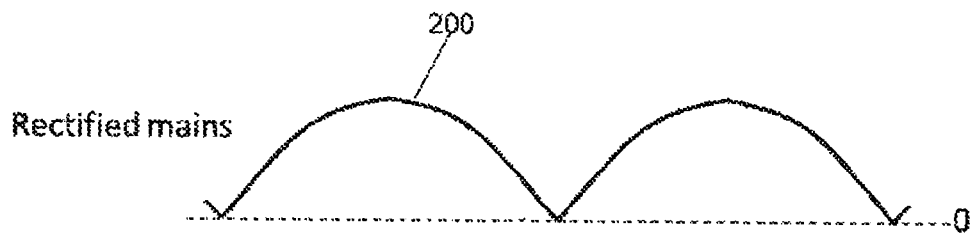
FIG. 2a illustrates a signal derived from a full period of a rectified sinusoidal AC mains signal against time.

FIG. 2a illustrates, against time, a signal 200 derived from a rectified full period of a sinusoidal AC mains signal.

Figure 2B:
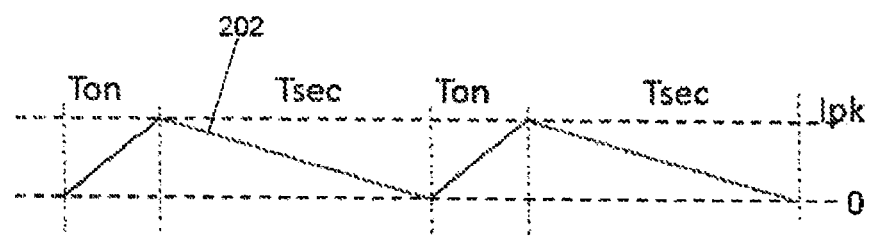
FIG. 2b illustrates, against time, an inductor current in an inductor of the SMPS of FIGS. 1a to 1c during two cycles of the SMPS.

FIG. 2b illustrates an inductor current 202 in the inductor of the SMPS of FIGS. 1a to 1c against time during two switching cycles. It should be noted that a switching cycle is much shorter than a mains power supply cycle. The switch toggling unit typically may have a frequency of tens or hundreds of kHz, whereas the mains supply typically has a frequency of 50 or 60 Hz. The duration of the time axis in FIG. 2b is therefore of the order of one thousandth of the duration of the time axis shown in FIG. 2a.

The switch toggling unit of the controller is operating in a boundary conduction mode (BCM) in order to provide the inductor current 202. The inductor current 202 follows a triangular shape in which it rises while the power switch is closed, during the primary stroke Ton, and falls when the switch is opened, during the secondary stroke Tsec, as the stored energy in the inductor discharges. In BCM, the switch is closed immediately upon the inductor current 202 falling to zero and so the SMPS operates at the boundary between a continuous conduction mode (CCM), in which the switch would be closed before the current falls to zero, and a discontinuous conduction mode (DCM), in which the switch would not be opened until after the current falls to zero.

If the controller controls the power switch such that the primary stroke has a fixed duration Ton, then the peak current Ipk of the inductor current 202 is a function of the rectified mains supply 200.

Figure 2C:
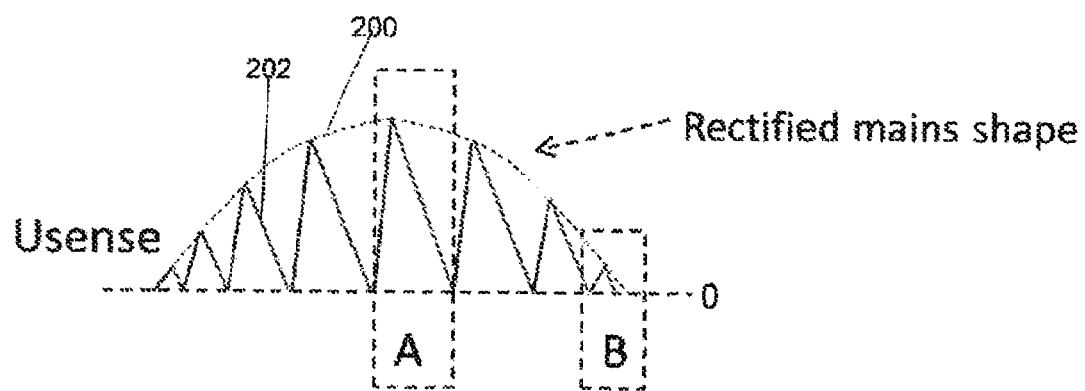

FIG. 2c illustrates a simplified example of the inductor current 202 superimposed on the rectified mains signal 200. For clarity and ease of illustration, only 8 switching cycles are shown within the half period of the mains supply, although it will be appreciated that in reality there would be many thousands of switching cycles within the half period of the mains supply. The inductor current 202 conforms to the envelope of the rectified mains signal 200. The inductor current 202 is equal to Usense/R1, where Usense is the voltage dropped across the sense resistor and R1 is the resistance of the sense resistor. The inductor current can therefore be measured using a sense voltage across the sense resistor.

During zero crossings of the rectified mains signal 200, the peak current Ipk of the inductor current 202 also drops towards zero.

The peak current Ipk of the inductor current 202 is given as $$Ipk=Urect\_mains/L*Ton,$$

where Urect_mains is the voltage of the rectified mains signal 200 dropped across the sense resistor; L is the inductance of inductor and Ton is the duration of the primary stroke in which the power switch is closed.

The period of the secondary stroke in BCM is given by $$Tsec=Ipk*L/Uled,$$

where Uled is the voltage across the LED string plus the forward voltage of the buck diode.

It follows that $$Tsec=Urect\_mains/Uled*Ton.$$

If the primary stroke duration Ton is fixed and the peak current Ipk is low around the zero crossings of the mains, the secondary stroke will be short.

In boundary conduction mode (BCM), the switching period of the SMPS is equal to the duration of the primary stroke Ton (which is fixed for a given desired output voltage) plus the duration of the secondary stroke Tsec (which may vary). The switching frequency Fsw of the controller is therefore $$Fsw=(1/(Ton+Tsec).$$

The switching frequency Fsw of the controller is therefore a function of rectified mains signal Urect_mains 200. The switching frequency Fsw is higher when the voltage of the rectified mains signal 200 is lower. This can be seen by comparing the switching cycle labelled A in FIG. 2c, which occurs at the peak of the rectified mains signal 200, and the switching cycle labelled B, which occurs when the rectified mains signal 200 is near 0 V.

The energy, E, stored in the inductor during the primary stroke is given by $$E=½*L \cdot Ipk^2.$$

The energy, E, stored in the inductor is therefore at a minima about the zero crossings of rectified mains signal 200 because peak current Ipk through the inductor is as its lowest.

In summary, around the zero crossings of the rectified mains signal 200, the switching frequency is high, while the energy stored is low. Because the switching losses are, in first order, linearly related to the switching frequency, the efficiency of power conversion is therefore low around the zero crossings of the rectified mains signal 200.

Figure 3:
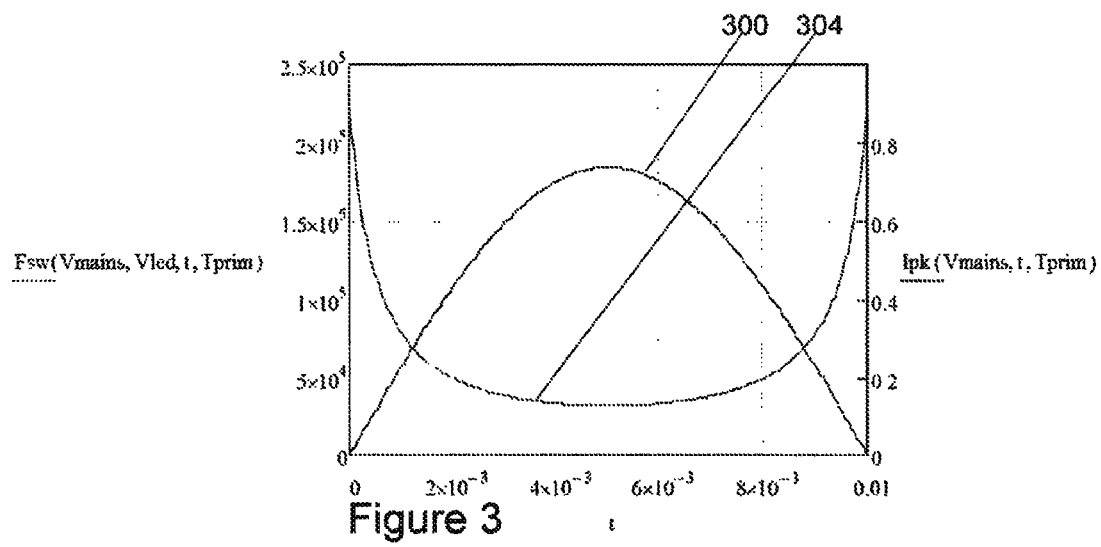
FIG. 3 illustrates, against time, a signal derived from a rectified mains supply similar to that of FIG. 2a and a corresponding SMPS switching frequency Fsw profile for a controller with a duty cycle similar to that discussed with reference to FIG. 2b.

FIG. 3 illustrates, against time, a peak current Ipk 300 associated with a rectified mains signal (similar to that discussed with reference to FIGS. 2a and 2c) and a corresponding SMPS switching frequency Fsw profile 304 for a SMPS configured to operate using the duty cycle discussed with regard to FIG. 2b.

The peak current Ipk 300 is representative of a 50 Hz mains signal. A half period of the mains signal is shown over the 0.01 s interval illustrated. The peak current Ipk 300 varies sinusoidally between about 0 A at 0 s to about 0.75 A at 0.005 s and back to about 0 A at 0.01 s.

The switching frequency Fsw profile 304 is at a maxima of about 220 kHz at 0 s and 0.01 s. The switching frequency Fsw profile 304 is at a minima of about 30 kHz at about 0.005 s. The transition between the maxima and minima appears hyperbolic.

Typically in a switched mode power supply (SMPS) when the stored energy in one switching cycle is small, the conversion efficiency drops as switching losses per cycle remain the same while the converted energy per cycle is small. Moreover, if the converter is working in boundary conduction mode (BCM), the switching frequency will increase when the energy in the inductor is reduced. The frequency increase results in even more switching losses, as discussed above with regard to FIGS. 2a to 2c.

One method of improving the efficiency of the SMPS of FIGS. 1a to 1c is to clamp the maximum switching frequency that can occur at about the zero crossings of the mains supply. TEA1750, described in a product data sheet "*TEA1750 GreenChip III SMPS control IC*", NXP Rev. 02 (15 Dec. 2008), (available online http://www.nxp.com/documents/data_sheet/TEA1750.pdf), is an example of such a controller.

Figure 4:
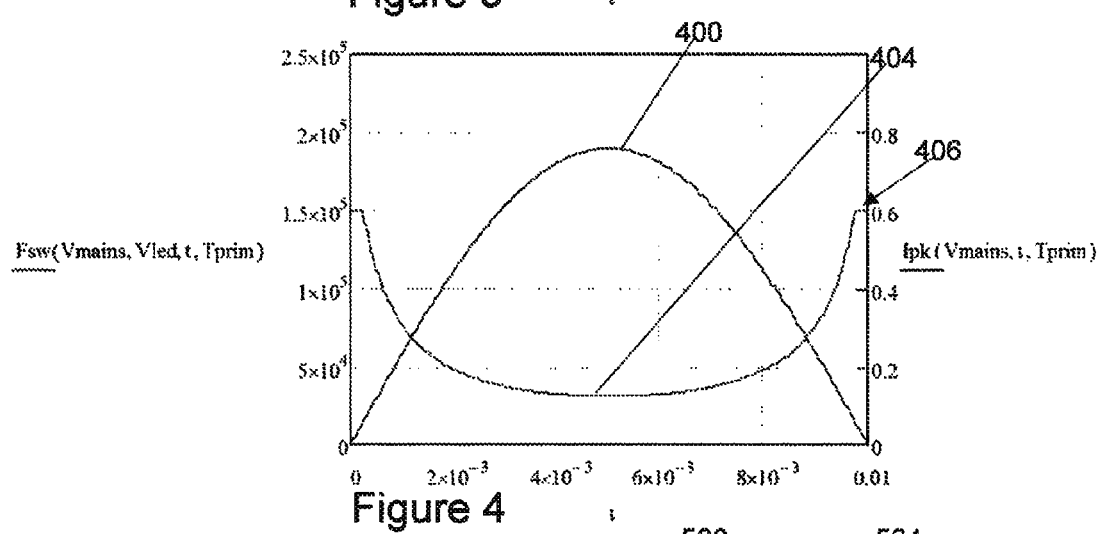
FIG. 4 illustrates, against time, a signal derived from a rectified mains supply similar to that of FIG. 2a and a corresponding SMPS switching frequency Fsw profile for a controller with a clamped maximum frequency.

FIG. 4 illustrates, against time, a peak current Ipk 400 associated with a rectified mains signal and a corresponding switching frequency Fsw profile 404 for a SMPS in which the maximum switching frequency is clamped. The rectified mains signal is similar to that discussed with regard to FIG. 3. However, the switching frequency Fsw profile 404 differs from that discussed in relation to FIG. 3 in that it has a clamped maximum level 406, which is 150 kHz in this example. The clamped maximum level 406 is reached when the peak current Ipk 400 approaches the zero level. When the switching frequency Fsw profile 404 reaches a certain maximum value, the next switching cycle is delayed. In this example, the switching losses are limited, but the efficiency of the power conversion around the zero crossing of the mains remains low because the efficiency is also dependent on the peak current through the inductor of the SMPS.

Another method of improving the efficiency of the SMPS of FIGS. 1a to 1c is to only perform switching within a time window.

Figure 5:
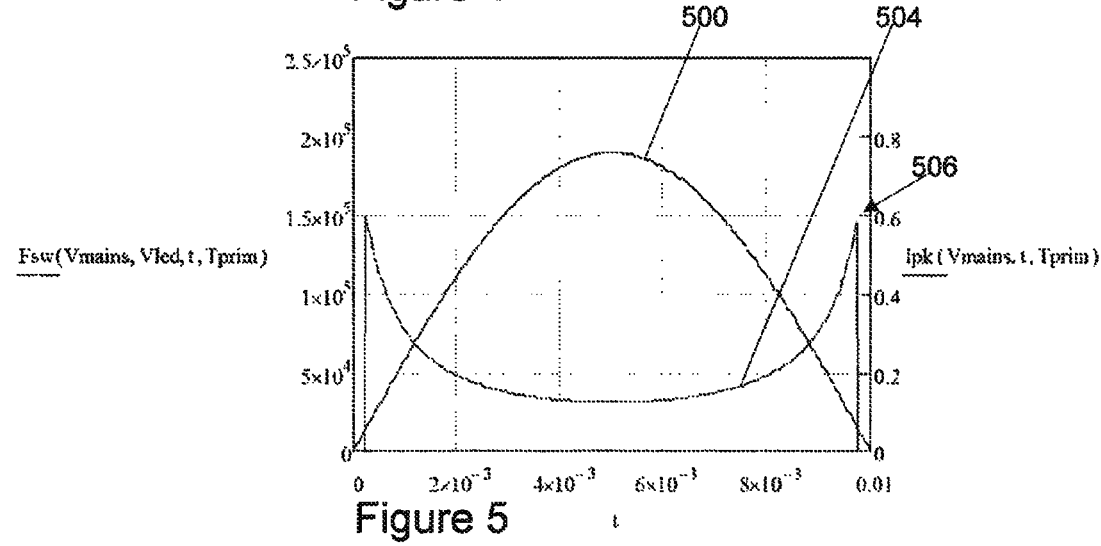
FIG. 5 illustrates, against time, a signal derived from a rectified mains supply similar to that of FIG. 2a and a corresponding SMPS switching frequency Fsw profile for a controller that provides time-windowed switching.

FIG. 5 illustrates, against time, a peak current Ipk 500 associated with a rectified mains signal and a corresponding switching frequency Fsw profile 504 for a SMPS in which switching is time-windowed. The rectified mains signal is similar to that discussed with regard to FIG. 3. The switching frequency Fsw profile 504 is similar to that discussed with regard to FIG. 4, expect that instead of taking a clamped maximum value when the peak current Ipk 500 reaches a lower threshold, the switching frequency Fsw profile 504 falls asymptotically to 0 Hz during a period 506 in which the peak current Ipk 500 is below the lower threshold.

In the window control system, switching is inhibited around the zero crossings of the mains. Such a controller may be considered to provide a switch toggling unit having a first switching mode and a second switching mode, wherein the first switching mode is a boundary conduction mode and the second switching mode is a non-switching mode.

The efficiency of the controller will therefore be improved compared to the example discussed in regard to FIGS. 1a to 1c because switching does not occur when the peak current through the winding is low. In order to implement the control window, a detection circuit is needed in order to detect the zero crossings of the mains. One way of doing this is to provide additional control circuitry that makes a measurement of a rectified mains supply. A switch mode selector within the controller may then be configured to set the switching mode of the switch toggling unit in accordance with the measurement of the rectified mains supply.

Figure 6:
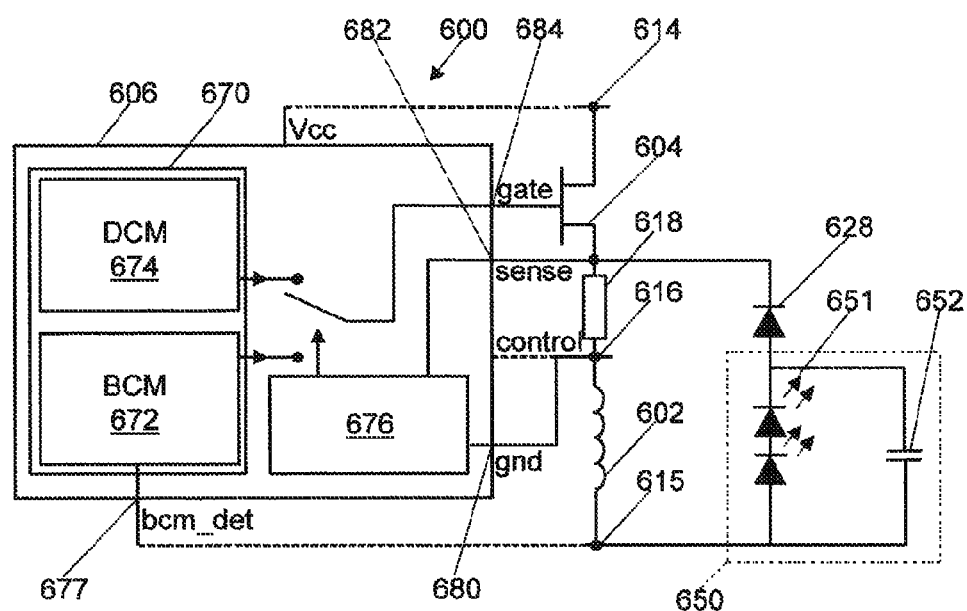
FIG. 6 illustrates a schematic of a portion of a SMPS comprising a controller that sets a switching mode in accordance with a current in an inductor of the SMPS.

FIG. 6 illustrates a portion of a particularly advantageous buck-boost switched mode power supply (SMPS) 600. The SMPS 600 comprises a power switch 604, a controller 606 and a buck loop. The buck loop comprises an inductor 602, a sense resistor 618, a buck diode 628 and an output element 650 in a similar arrangement to the components described with reference to FIG. 1. Corresponding reference numerals in the series 600 are used to refer to components that are similar to those described with reference to FIG. 1.

The controller has a fixed number of pins (six in this example), with an arrangement similar to that of the pins of the controller in FIG. 1. Minimising the number of terminals of the controller can be important for some applications in order to reduce costs and printed circuit board area occupation. The pins include:

1) a ground terminal (gnd) 680 connected to the ground 616;
2) a voltage sensing terminal (sense) 682 connected to a junction between the power switch 604 and the sense resistor 618;
3) a control terminal (control) connected to a junction between the inductor 602 and the sense resistor 618;
4) a Vcc terminal (Vcc) for receiving a controller input voltage from the rectified mains terminal 614;
5) a switch gate terminal (gate) 684 for providing a switch control signal to a gate of the power switch 604; and
6) a boundary conduction mode detection terminal (bcm-det) for receiving a signal from the inductor 602 in order for the controller to determine whether boundary conduction has occurred.

The controller 606 comprises a switch toggling unit 670 and a switch mode selector 676. The switch toggling unit 670 has a first switching unit 672 and a second switching unit 674. The first and second switching units 672, 674 are selectably couplable to the gate control terminal 684 of the controller by the switch mode selector 676. The first switching unit 672 of the switch toggling unit 670 is configured to operate the switch 604 in a boundary conduction mode using a signal provided at the boundary conduction mode detection terminal (bcm_det) 677. Alternatively, the first switching unit 672 could operate the switch 602 in a continuous conduction mode.

The second switching unit 674 is configured to operate the switch 604 in a discontinuous conduction mode. In the discontinuous conduction mode, the primary stroke, transition to the secondary stroke and the secondary stroke in a switching cycle are similar to those in the boundary conduction mode. However, in the discontinuous conduction mode a dead time or delay period is provided at the end of a switching cycle, after the end of a secondary stroke and before the beginning of the next cycle. That is, after a secondary stroke is complete, switching is suspended for the delay period before a primary stroke of the next switching cycle is initiated. A discontinuous conduction mode may be characterised by comprising a plurality of such switching cycles that each include a delay period.

The second switching mode/discontinuous conduction mode is optionally provided as a fixed frequency switching mode or with a delay period of a fixed duration. A frequency of the second switching mode may be above audible frequencies, so greater than 15 kHz or 20 kHz, for example. The frequency may also be relatively low compared to the maximum frequency shown in FIG. 4 in order to reduce switching losses. The fixed frequency may therefore advantageously be less than 25 kHz, 40 kHz or 50 kHz, for example. The frequency of the second switching mode may be less than the lowest frequency in the first switching mode. A transition between the first switching mode and the second switching mode results in a reduction in the instantaneous switching frequency, and therefore an increase in efficiency compared to the efficiency that would have been achieved if the first switching mode had been continued.

The switch mode selector 676 is configured to set the switching mode of the switch toggling unit 670 in accordance with a current in the inductor 602 of the SMPS. Specifically, the switch mode selector 676 is configured to, if the second switching unit 674 is active, select the first switching unit 672 when a peak current in the inductor during a particular switching cycle is greater than a first threshold. The switch mode selector 676 is configured to, if the first switching unit 672 is active, select the second switching unit 674 when the peak current is less than a second threshold. The first threshold may be the same as the second threshold. Alternatively, the thresholds may be different in order to provide hysteresis.

By changing the switching mode of the switch toggling unit 670 from BCM to a relatively low frequency DCM on detection of the peak current in the inductor 602 falling below the second threshold, the switch mode selector can reduce switching losses and electromagnetic interference and also more accurately control the average output current of the SMPS 600.

Besides reducing switching losses, the controller 606 may also reduce electromagnetic interference (EMI) by limiting the switching frequency of the SMPS around the time of the mains supply zero-crossing.

Parasitics (for example, parasitic capacitance) tend to dominant the inductor current at high frequencies and low peak currents, which would cause regulation inaccuracy in LED applications, for example. A further advantage of the use of the controller 606 for LED applications is therefore that LED current regulation inaccuracy due to parasitics is reduced.

The switch mode selector 676 is configured to determine the peak current in the inductor 602 based on a measurement of a voltage across a sense resistor 618. The sense resistor 618 is connected between the sense terminal (sense) 682 and the ground terminal (gnd) 680 of the controller 606.

An advantage of the current sensing mechanism of the switch mode selector 676 is that the sensing functionality is provided using the same pins as the controller described with reference to FIG. 1. The controller 606 may therefore directly replace the controller of FIG. 1 without any further modifications to the circuit of FIG. 1 being required. In the controller of FIG. 1, the voltage sensing terminal (sense) is used to determine if a high current condition exists in the inductor 602, in which case operation of the controller may be suspended for safety reasons. The switch mode selector 676 also makes use of the voltage at the voltage sensing terminal (sense) 682 in order to determine when the voltage is lower than a low voltage threshold, which corresponds to when the inductor current is lower than a low current threshold. The pin count of the controller can therefore be reduced compared to an implementation that requires additional connections to other components of the power supply in order to determine a phase of the rectified mains supply.

In order for the switch mode selector 676 to be able to monitor the level of the peak current in the inductor 602, switching of the switch 602 is required so that energy is stored in, and discharged from, the inductor 602. The switch mode selector 676 therefore selects the discontinuous switching unit 674 when the inductor current is low (rather than simply suspending switching which would mean that information regarding the value/phase of the mains signal at the bcm-det terminal 677 is lost).

Another advantage of the controller 606 is that it can be used with a power supply where the mains frequency is not known. The controller may therefore be used with a range of mains frequencies, such as 50 or 60 Hz supplies without requiring any reprogramming.

Figure 7:
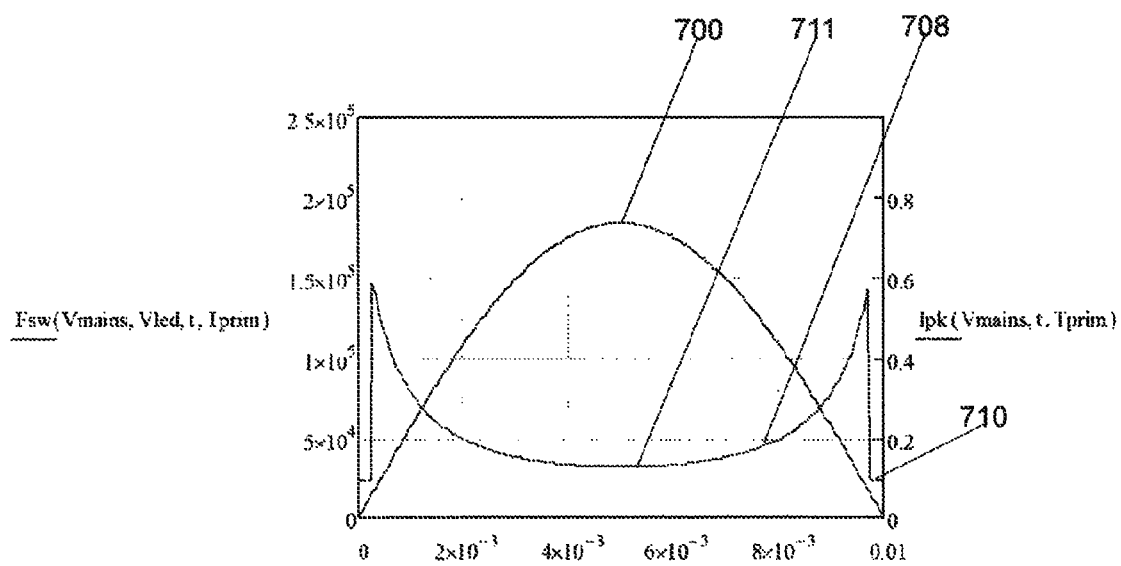
FIG. 7 illustrates, against time, a signal derived from a rectified mains supply similar to that of FIG. 2a and a corresponding SMPS switching frequency Fsw profile for the controller of FIG. 6.

FIG. 7 illustrates, against time, a peak current Ipk 700 associated with a rectified mains signal and a corresponding SMPS switching frequency Fsw profile 708 for the controller of FIG. 6. The rectified mains signal is similar to that discussed with regard to FIGS. 3, 4 and 5. The switching frequency Fsw profile 708 differs from that discussed in relation to FIG. 5 in that fixed frequency, discontinuous switching 710 is provided around the zero crossing of the power supply. The fixed frequency is 25 kHz in this example, which is lower than the lowest BCM frequency 711. The discontinuous switching 710 is performed when the peak current Ipk 400 approaches the zero level (for example, it reaches a threshold equivalent to 5% or 10% of the maximum value of the peak current Ipk 700, or any suitable predefined value).

In this example, the switching losses are limited, and the efficiency of the power conversion around the zero crossing of the mains is improved compared to the examples in FIGS. 3 and 4 because switching at low currents occurs at a relatively low frequency. The principal purpose of the fixed frequency, discontinuous switching 710 is, as discussed with reference to FIG. 6 above, to provide the controller with information regarding the current in the inductor, rather than to transfer energy to the inductor, so that the controller can determine when to change back to BCM.

Figure 8A:
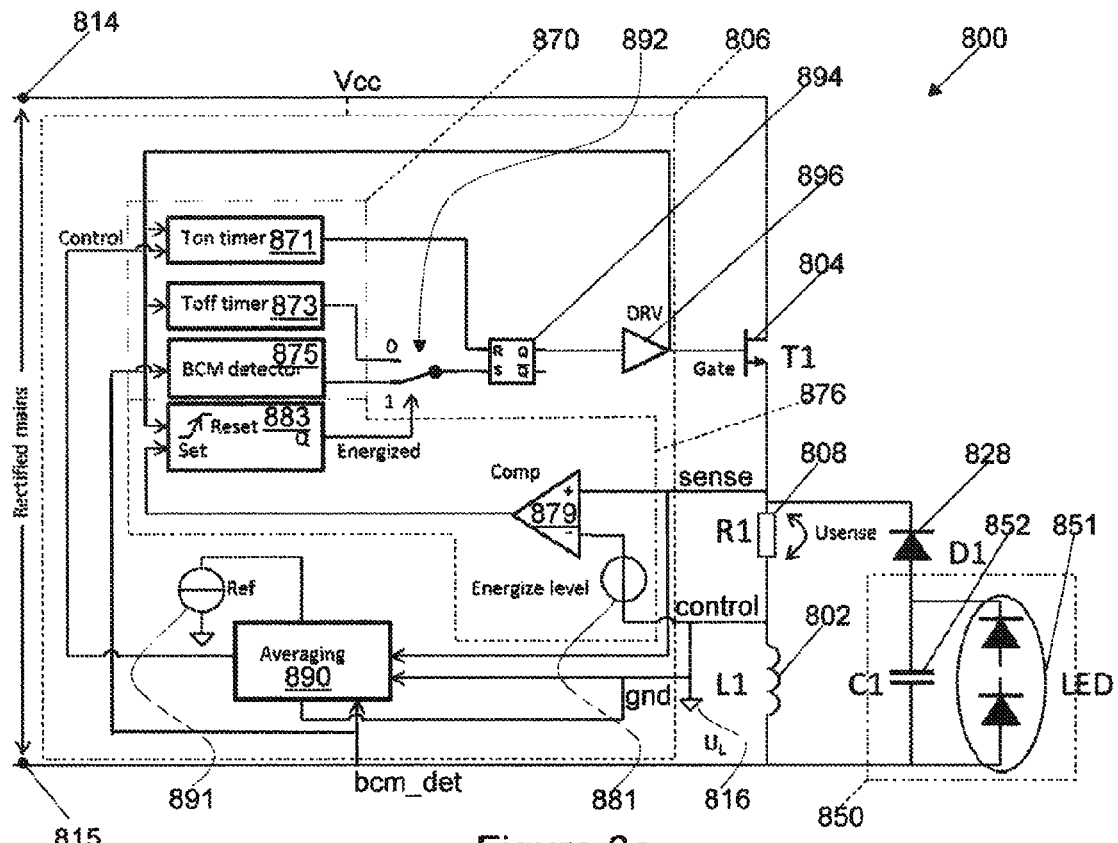
FIG. 8a illustrates a schematic of a SMPS comprising an implementation of the controller of FIG. 6.

FIG. 8a illustrates a schematic of a switched mode power supply (SMPS) 800 comprising an implementation of the controller of FIG. 6. The connections between the terminals of the controller 806 and the remainder of the components are similar to those of FIG. 6 (the connections to the Vcc terminal are omitted for clarity). The components outside of the controller 806 have a similar function to those described with reference to FIGS. 1a to 1c and 6 and will not be described further here.

The switch toggling unit comprises a primary stroke timer 871, a delay timer 873 and a boundary conduction mode (BCM) detector 875. The primary stroke timer 871 and the delay timer 873 receive the switch control signal provided to the gate terminal (gate) of the controller 806 as an input. The primary stroke timer 871 also receives an input signal from an averaging unit 890. The BCM detector 875 receives an input signal from the averaging unit 890 and an input signal from the BCM detection terminal (bcm_det). The BCM detector 875 and the averaging unit 890 both use a voltage UL across the inductor 802 in order to determine time periods for the SMPS.

A first SR flip-flop 894 has a set input S, a reset input R and an output Q. The reset input R is connected to an output of the primary stroke timer 871. The set input S is connected to an output of a switch 892. The switch 892 has two selectable inputs. A first input (0) of the switch 892 is connected to the output of the delay timer 873. A second input (1) of the switch 892 is connected to the output of the BCM detector 875. The output Q of the first SR flip-flop 894 is provided as a switch driving signal at the gate terminal (gate) of the controller 806 via a driver buffer 896.

The primary stroke timer 871 sets the on-time Ton of switch 804. The on-time Ton is determined from the control signal (control) that is provided to the averaging unit 890. The control signal (control) is generated by the averaging circuit 890 in order to regulate an average of the voltage Usense across the sense resistor 808 during the secondary stroke to be equal a reference value, Ref.

Figure 8B:
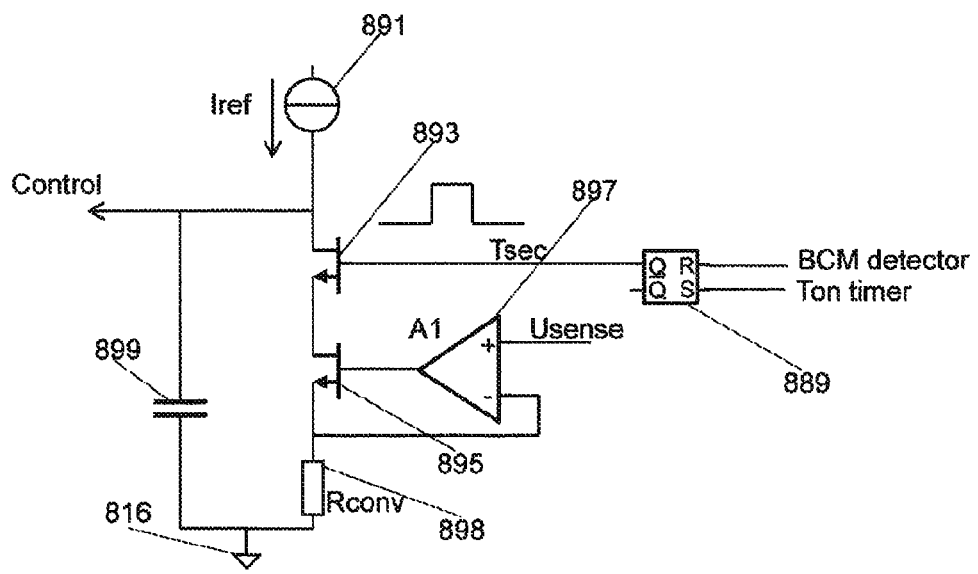

An example implementation of the averaging unit 890 is illustrated in FIG. 8b. The averaging unit 890 comprises a first switch 893 and a second switch 895, each having a controllable conduction channel and a gate. The conduction channels of the first and second switches 893, 895 are connected in series between a reference current source 891 and the ground terminal 816 (via an averaging unit resistor 898). The reference current source 891 provides a reference current Iref.

Figure 9:
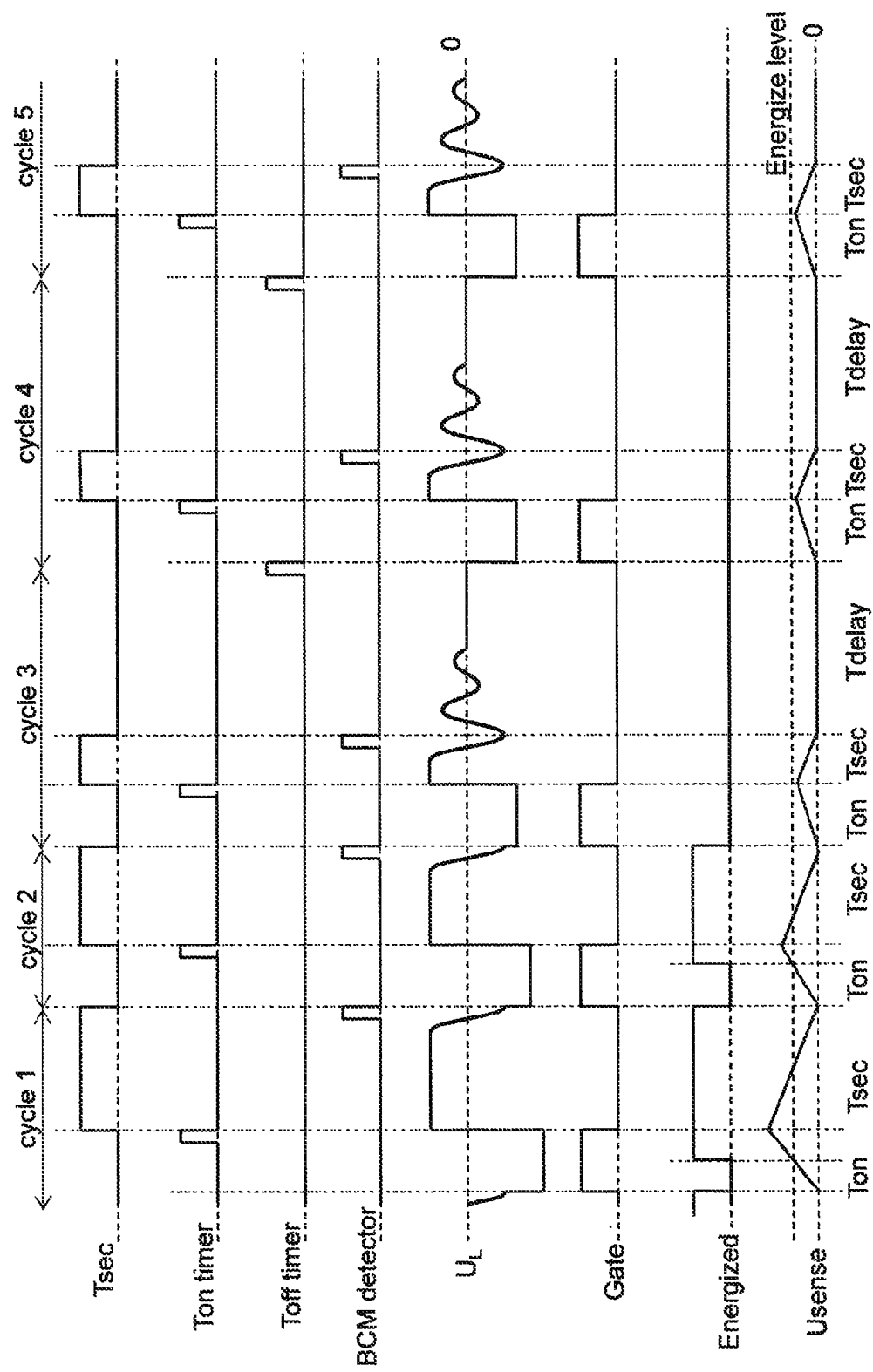
FIG. 9 illustrates a set of signals from the controller of FIG. 8a during five switching cycles.

An averaging unit SR flip-flop 889 has a set input S, a reset input R and an output Q. The gate of the first switch 893 is connected to the output Q of the averaging unit SR flip-flop 889. The reset input R of the averaging unit SR flip-flop 889 is connected to the BCM detection terminal (bcm_det). The set input S of the averaging unit SR flip-flop 889 is connected to the output of the primary stroke timer 871 (the connection is not shown in FIG. 8a). The gate of the first switch 893 is driven by the averaging unit SR flip-flop 889, rather than by a signal directly received from the BCM detection terminal (bcm_det) because it can be beneficial not to drive the first switch 893 when the inductor voltage is ringing during the delay period. The ringing signal during the delay period is illustrated in FIG. 9 and discussed further below.

The gate of the second switch 895 is connected to an output of an amplifier 897. The amplifier 897 has a non-inverting input and an inverting input. The non-inverting input is connected to the voltage sensing terminal (sense) of the controller 806. The inverting input is connected to a junction between the conduction channel of the second switch 895 and the averaging unit resistor 898. The output of the averaging unit is taken from the junction between the reference current source 891 and the conduction channel of the first switch 893. An averaging capacitor 899 is also connected between the ground terminal 816 and the junction between the reference current source 891 and the conduction channel of the first switch 893.

The averaging circuit 890 is configured to regulate the on-time via the control signal such that an average current through averaging unit resistor 898 is equal to the reference current Iref from the reference current source 891. The effect of the averaging unit 890 is that the duration of the primary stroke is modified depending on the difference between the sense current in the sense resistor 808 and the reference current Iref. The operation of the averaging circuit 890 and controller 806 as a whole is discussed below with regard to FIG. 9.

Returning now to FIG. 8a, where the switch mode selector 876 is shown. The switch mode selector 876 comprises a comparator Comp 879. The comparator Comp 879 has a non-inverting input and an inverting input. The non-inverting input is connected to the voltage sensing terminal (sense) of the controller 806. The inverting input is configured to receive a reference voltage 881 with respect to ground at the ground terminal (gnd). The comparator Comp 879 is configured to provide an output in accordance with a difference between a voltage Usense dropped across the sense resistor 808 and the reference voltage 881. The reference voltage 881 can therefore be considered to represent a threshold voltage, or "energize level" that is used to determine whether the SMPS should operate in BCM or DCM. The output of the comparator (Comp) 879 is provided to a set input of a second SR flip-flop. The second SR flip-flop controls the switch 892 in order to set a switching mode of the switch toggling unit 870 based on the comparison between the voltage Usense dropped across the sense resistor 808 and the reference voltage 881. When the second SR flip-flop outputs a high signal (logic level 1), the signal from the boundary conduction mode (BCM) detector 875 is used to set the first SR flip-flop 894. When the reference voltage, or energize level, is not reached in a switching cycle, the second SR flip-flop 883 outputs a low signal (0) and the switch 892 connects the set input S of the SR flip-flop 894 to the primary stroke timer 871, rather than to the BCM detector 875. The second SR flip-flop 883 is reset by a rising edge of a signal at the gate terminal (gate). In this way, the switching mode of the switch toggling unit 870 is set in accordance with the current in the inductor of the SMPS.

An over-current protection comparator (not shown) may be provided adjacent to the comparator Comp 879. The overcurrent comparator may compare the signal derived from the voltage sensing terminal (sense) with an over-current reference signal. The output of the over-current protection comparator can be provided as an additional reset R of the first SR flip-flop 894. The over-current protection comparator can determine when an over-current is present in the inductor 802, which may be caused by a fault condition, for example. Over-current protection prevents overheating and/or malfunctioning of the SMPS 800.

FIG. 9 illustrates a set of signals from the controller of FIG. 8a during five switching cycles.

In the first two switching cycles, a voltage Usense across the sensing resistor reaches and exceeds the threshold voltage (energize level) and so the switch mode selector sets the switching mode of the switch toggling unit to be BCM between the second and third cycles. The BCM behaviour during the first and second cycles can be seen in that the gate of the switch is activated to start the primary stroke of the next cycle immediately on the current in the inductor (and so the voltage Usense across the sensing resistor) falling to zero. In the next three cycles, the voltage Usense across the sensing resistor does not reach the energize level and so the switch mode selector sets the switching mode of the switch toggling unit to be DCM for the third, fourth and fifth cycles. The DCM behaviour during the third, fourth and fifth cycles can be seen in that the gate of the switch is activated to start the primary stroke of a subsequent cycle a delay period Tdelay after the current in the inductor falls to zero at the end of a secondary stroke of the preceding cycle. The switching frequency is reduced using DCM compared to BCM because each switching cycle period has been extended by the delay period Tdelay.

As well as the Usense profile and gate profile, a number of other profiles are shown in FIG. 9.

The voltage UL across the inductor is relatively constant and negative with respect to ground during the primary stroke. The voltage UL across the inductor is generally level and positive with respect to ground during the majority of the secondary stroke (Tsec). At the end of the secondary stroke, when the energy in the inductor is almost exhausted, the voltage UL drops towards ground and a ringing period starts. The ringing period continues into the delay period Tdelay in the switching DCM cycles where the energize level (threshold voltage) of the voltage Usense across the sense resistor is not met.

The BCM detector may be configured to detect the ringing in order to determine the end of the secondary stroke. When the BCM mode has been selected by the switch mode selector, the output of the BCM detector initiates the primary stroke of the subsequent switching cycle.

The output Tsec of the averaging unit SR flip-flop is high during the secondary stroke because the averaging unit SR flip-flop is set by a (falling edge of a) pulse from a primary stroke timer, which occurs at the end of the primary stroke, and is reset by a (falling edge of a) pulse from the BCM detector, which occurs at the end of the secondary stroke.

At the end of the delay period Tdelay (also referred to as Toff in FIG. 8a), the output of the delay timer goes high in order to set the first SR flip-flop and so start the primary stroke. When the DCM mode has been selected by the switch mode selector, the output of the delay timer initiates the primary stroke of the subsequent switching cycle.

Once the primary stroke is initiated, the primary stroke timer starts. When the primary stroke period Ton has elapsed, the output of the primary stroke timer goes high in order to reset the second SR flip-flop and so end the primary stroke.

In LED dimming applications, the reference current Iref in the averaging unit can be varied or reduced. The control signal provided by the averaging unit determines the duration of the primary stroke that is controlled by the primary stroke timer. Reducing the reference current Iref therefore results in a lower on-time (primary stroke) and so a lower peak current in the inductor. When the on-time is reduced, the secondary time also reduces according to the relationship $$T\text{sec}=U\text{rect\_mains}/U\text{led}*T\text{on}$$

Where Urect_mains is the rectified mains supply voltage, Uled is the voltage across the string of LEDs and Ton is the duration of the primary stroke.

During dimming the switching frequency will increase because the primary and secondary strokes are shortened. The associated increase in the switching frequency results in higher switching losses and greater inaccuracies in the LED current. Again, by detecting the peak current via the current sense resistor, the switching frequency can be reduced when a predetermined peak current level in the inductor is not reached during a switching cycle. This beneficial functionality may not be afforded by some time-windowed mode selection techniques.

The voltage Usense across the sense resistor is given by $$U\text{sense}=R\text{sense}*I\text{pk}=R\text{sense}*U\text{rect\_mains}/L*T\text{on},$$

The averaging circuit of FIG. 8b regulates the on-time via the control signal such that the average current through the averaging unit resistor is equal to the reference current Iref.

$$I\text{ref} = F\text{sw}\int_{T\text{on}}^{T\text{on}+T\text{sec}} \frac{U\text{sense}}{R\text{conv}} dt$$

If the switching frequency Fsw is reduced for a given reference current Iref, the integral part of the above equation has to increase. The averaging circuit will increase the duration Ton of the primary stroke, which results in a larger peak current.

The converted energy, E, is equal to $E=F\text{sw}*\frac{1}{2}*L\cdot I\text{pk}^2$ So by reducing the switching frequency, the peak current will be higher for a given LED power level. The higher peak current causes the voltage Usense across the sense resistor to increase. Any error due to an offset in amplifier can therefore be reduced.

The controller described with reference to FIG. 6 or FIG. 8 may be used in a switched mode power supply with a variable switching frequency, such as a switched mode power supplies for an LED application and a power factor control circuit.

Figure 10A:
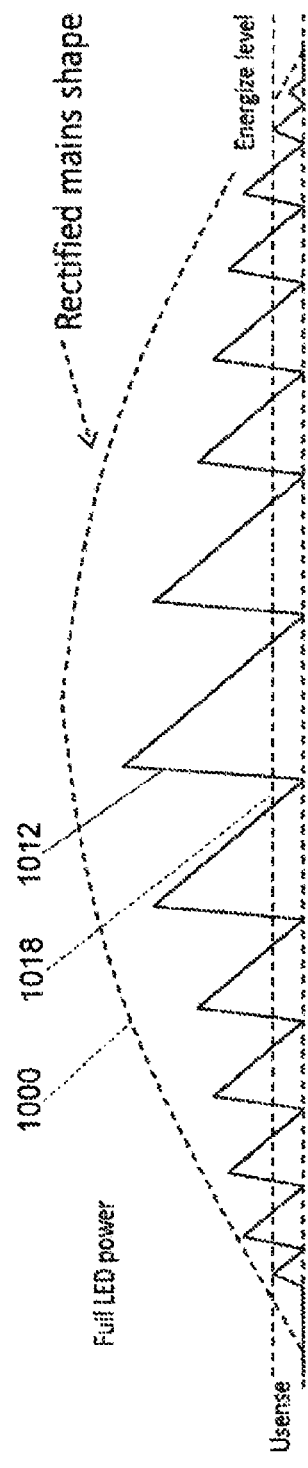
FIGS. 10a to 10c illustrate a rectified mains waveform 1000 and associated inductor currents corresponding to different dimming levels.
Figure 10B:
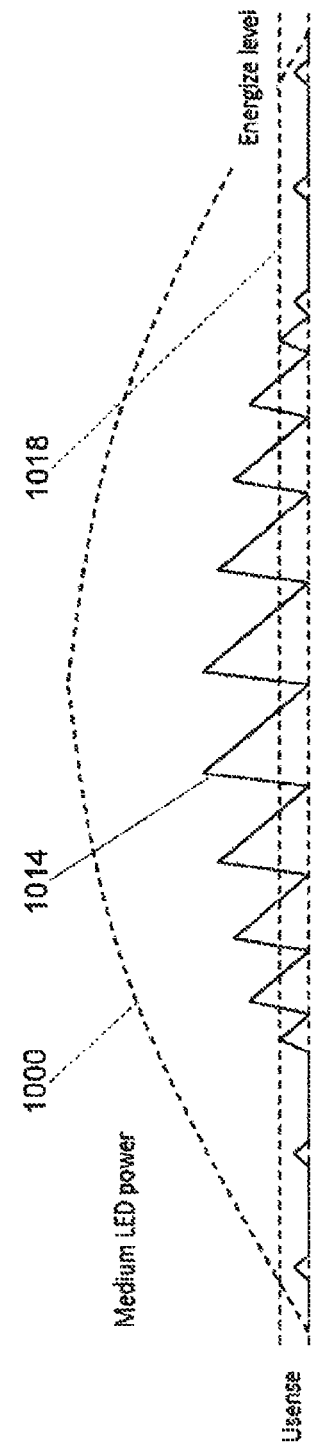
Figure 10C:
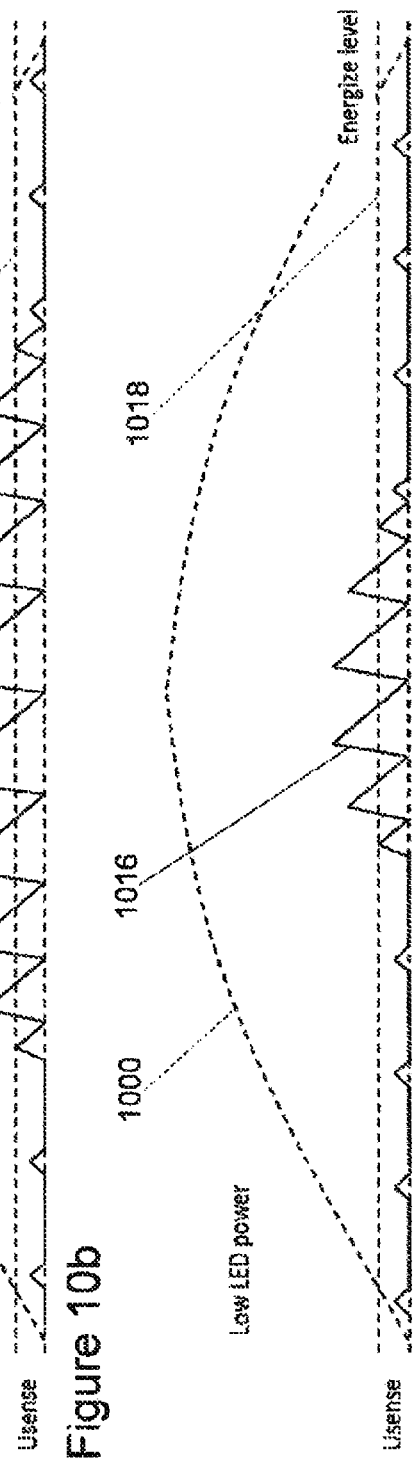

FIGS. 10a to 10c illustrate a rectified mains waveform 1000 and voltages 1012, 1014, 1016 associated with inductor currents corresponding to various different dimming levels of an SMPS for an LED lighting application. An energize level (threshold) 1018 is also illustrated.

In FIG. 10a, the SMPS is operated in a full power condition. The peak sense voltage 1012 is above the energize level (threshold) 1018 for most of switching cycles in the mains half-period.

The switching frequency Fsw is lowered by when a delay period is added to a switching cycle. The power Pled flowing to the LED is given by $$P\text{led}=\frac{1}{2}*L*I\text{pk}^2*F\text{sw}$$

The peak current Ipk through the inductor may remain relative high during dimming compared to peak current level when the switching frequency Fsw increases a when the rectified mains signal is close to zero (for the same desired LED power).

In FIG. 10b, the SMPS is being operated in a medium power condition. The LED current is lowered in order to provide the medium power condition. The peak sense voltage 1014 is above the energize level (threshold) 1018 for fewer of the switching cycles in FIG. 10b than in FIG. 10a.

In FIG. 10c, the SMPS is being operated in a low power condition. The LED current is lowered in order to provide the low power condition. The peak sense voltage 1016 is above the energize level (threshold) 1018 for fewer of the switching cycles in FIG. 10c than in FIG. 10a or FIG. 10b.

The relatively high peak current, even during dimming, creates a higher sense voltage across the sense resistor which can be measured more accurately by the averaging circuit in the controller; any offset voltages in the averaging circuit have a lower contribution to the total error of the controller when the sense voltage is larger.

Although the examples herein relate generally to buck-boost converters, it will be appreciated that the controllers described herein may be used with other types of switched mode power supplies, such as a flyback converters for example.

The invention claimed is:

1. A controller for a switched mode power supply, SMPS, comprising:
    a switch toggling unit configured to toggle a power switch with a fixed primary stroke duration within each switching cycle in which the power switch is closed, the switch toggling unit having a first switching mode and a second switching mode, wherein the first switching mode is a continuous conduction mode or a boundary conduction mode and the second switching mode is a discontinuous conduction mode; and
    a switch mode selector configured to determine the current in an inductor of the SMPS based on a measurement of a voltage across a sense resistor having a first terminal that is directly connected to the inductor of the SMPS and to ground and a second terminal that is connected to the power switch and to set the switching mode of the switch toggling unit in accordance with a peak current in the inductor of the SMPS,
    wherein the switch mode selector is configured to:
    set the switching mode of the switch toggling unit as the first switching mode when the peak current in the inductor of the SMPS is greater than a first threshold; and set the switching mode of the switch toggling unit as the second switching mode when the peak current in the inductor of the SMPS is less than a second threshold, wherein the first threshold is the same as the second threshold.

2. The controller of claim 1, wherein each switching cycle of the second switching mode comprises a delay period with a fixed duration.

3. The controller of claim 2, wherein a frequency of the second switching mode is less than 40 kHz.

4. The controller of claim 3, wherein the frequency of the second switching mode is greater than 15 kHz.

5. The controller of claim 1, wherein the controller is provided in a single package with six or fewer terminals for connecting to components of the switched mode power supply.

6. The controller of claim 1, comprising a boundary conduction mode detector timer configured to detect an end of a secondary stroke during the first conduction mode.

7. The controller of claim 1, comprising a delay timer configured to provide a delay interval in the second switching mode.

8. The controller of claim 1, comprising a primary stroke timer configured to provide a primary stroke delay period for controlling a switch of the SMPS in accordance with a difference between the current in the inductor of the SMPS and a reference current.

9. A switched mode power supply, SMPS, comprising the controller of claim 8.

10. An LED lighting system comprising the controller of claim 8.

11. An LED lighting system comprising the switch mode power supply of claim 9.

* * * * *